(12) United States Patent
Mar

(10) Patent No.: US 6,636,086 B2
(45) Date of Patent: Oct. 21, 2003

(54) HIGH PERFORMANCE MICROWAVE SYNTHESIZER USING MULTIPLE-MODULATOR FRACTIONAL-N DIVIDER

(75) Inventor: Wing Jong Mar, Rohnert Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/733,870

(22) Filed: Dec. 8, 2000

(65) Prior Publication Data

US 2002/0070768 A1 Jun. 13, 2002

(51) Int. Cl.[7] .............................................. H03B 21/00
(52) U.S. Cl. ......................... 327/105; 327/145; 327/146
(58) Field of Search ................................. 327/145, 146, 327/155, 156, 105; 331/2, 25, 46, 51, 53, DIG. 2

(56) References Cited

U.S. PATENT DOCUMENTS

| | | | | |
|---|---|---|---|---|
| 4,516,083 | A | * | 5/1985 | Turney .......................... 331/25 |
| 5,055,800 | A | * | 10/1991 | Black et al. .................... 331/25 |
| 5,940,457 | A | * | 8/1999 | Dreifuss et al. ................ 331/2 |
| 6,005,443 | A | * | 12/1999 | Damgaard et al. ............. 331/25 |
| 6,016,069 | A | * | 1/2000 | Sadowski ..................... 327/156 |
| 6,150,890 | A | * | 11/2000 | Damgaard et al. ............. 331/25 |

* cited by examiner

Primary Examiner—Timothy P. Callahan
Assistant Examiner—Linh Nguyen

(57) ABSTRACT

A frequency synthesizer that includes an output oscillator, a difference circuit, a reference circuit, a feedback circuit and a comparator. The output oscillator generates an output signal whose frequency, $F_{OUT}$, is determined by an oscillator input signal. The difference circuit generates a sampled signal having a frequency, $F_{sif}=F_{OUT}-F_{OFFSET}$. The reference circuit generates a reference signal having a frequency $F_{ref}$. The reference circuit includes a reference oscillator for generating a high frequency reference oscillator output signal having a frequency $F_1$ and a first division circuit for generating a signal having a frequency equal to $F_1$ divided by R. The feedback circuit generates a feedback signal having a frequency, $F_{fb}$. The feedback signal generating circuit includes a second division circuit having a division factor chosen such that $F_{sif}/F_{fb}$ is minimized. The comparator compares the reference signal and the feedback signal and generates the oscillator input signal. One of the first and second division circuits is a Fractional-N Divider having a division factor, N.F, greater than 10. If the second division circuit is the Fractional-N Divider, the feedback circuit includes a multiplication circuit for generating a multiplied signal having a frequency equal to X times $F_{sif}$, and the Fractional-N Divider generates the feedback signal from the multiplied signal. In the preferred embodiment of the present invention, the first division circuit is the Fractional-N Divider. In one embodiment of the invention, the input to the Fractional N Divider varies over time thereby causing the output oscillator to sweep through a corresponding frequency range.

5 Claims, 4 Drawing Sheets

US 6,636,086 B2

HIGH PERFORMANCE MICROWAVE SYNTHESIZER USING MULTIPLE-MODULATOR FRACTIONAL-N DIVIDER

FIELD OF THE INVENTION

The present invention relates to microwave synthesizers, and more particularly, to a microwave synthesizer that requires fewer phase-lock loops for a given phase noise requirement.

BACKGROUND OF THE INVENTION

Microwave synthesizers are commonly used in test equipment to provide a test signal that sweeps a frequency range specified by the user. A microwave synthesizer can be designed using several approaches, depending on the performance requirements. The lowest cost approach utilizes a single phase-lock loop (PLL) design. In a single loop design, the output of the synthesizer is divided by a divider and compared against a reference frequency. Denote the division factor by $F_{div}$. When the loop is locked, the output frequency of the synthesizer is $F_{div}$ times the reference frequency. For every 1 Hz of frequency noise at the reference frequency, the output of the synthesizer has $F_{div}$ Hz of frequency noise. The noise gain of the PLL is thus $F_{div}$; hence, $F_{div}$ needs to be as small as possible to minimize noise. However, if one attempts to minimize $F_{div}$ by utilizing a large reference frequency, the output frequency resolution is reduced.

To overcome these conflicting requirements a Multiple-Modulator Fractional-N Divider (FND) is often utilized. An FND provides a division factor that is not restricted to integers. Denote the division factor by N.F, where F is the fractional part of the divisor. The minimum resolution is now determined by the amount that F can be incremented. Accordingly, smaller division factors can be utilized thereby reducing the noise gain.

Unfortunately, currently available Multiple-Modulator FNDs are inherently limited in the range of division factors they provide since the fractional division is implemented by hopping among the adjacent integer division factors to achieve the average N.F value. In particular, dividers that provide division factors less than about 10 can not be implemented due to the large disturbance to the loop that occurs with each hop. For a FND implemented with K modulators, to achieve the average division factor of N.F, the actual integer divider factor is varied between N−K to N+K+1. If 3 modulators are used to produce a division factor of 10.3, for example, the actual integer division values would vary between 7 to 14 and the maximum output frequency of the FND would be 100% greater than minimum output frequency. If N.F is 60.3, the maximum frequency would only be 64/57, or 12% higher than the minimum output frequency. The PLL can tolerate a small amount of frequency jitter. If larger frequency jitter is present, the PLL has difficulty locking and increased noise also becomes a problem. Accordingly, a large N.F value provides the best performance with respect to frequency division, and a small N.F provides the smallest noise gain. In addition, the output frequency of commercially available FNDs is limited to about 50 MHz. Hence, there is a lower limit on the noise gain that can be obtained using prior art FND PLL designs.

Broadly, it is the object of the present invention to provide an improved microwave frequency synthesizer.

It is a further object of the present invention to provide a microwave synthesizer that achieves the high resolution characterized by FND designs while providing reduced noise gain.

These and other objects of the present invention will become apparent to those skilled in the art from the following detailed description of the invention and the accompanying drawings.

SUMMARY OF THE INVENTION

The present invention is a frequency synthesizer that includes an output oscillator, a difference circuit, a reference circuit, a feedback circuit and a comparator. The output oscillator generates an output signal whose frequency, $F_{OUT}$, is determined by an oscillator input signal. The difference circuit generates a signal having a frequency, $F_{sif}=F_{OUT}-F_{OFFSET}$. The reference circuit generates a reference signal having a frequency $F_{ref}$. The reference circuit includes a reference oscillator for generating a reference oscillator output signal having a frequency $F_1$ and a first division circuit for generating a signal having a frequency equal to $F_1$ divided by R. The feedback circuit generates a feedback signal having an output frequency, $F_{fb}$, from the input signal $F_{sif}$. The feedback signal generating circuit includes a second division circuit having a division factor chosen such that $F_{sif}/F_{fb}<10$ to minimize the noise gain. The comparator compares the reference signal and the feedback signal and generates the oscillator control signal. One of the first and second division circuits is a Fractional-N Divider having a division factor, N.F, greater than 10. If the second division circuit is the Fractional-N Divider, the feedback circuit includes a multiplication circuit for generating a multiplied signal having a frequency equal to X times $F_{sif}$, and the Fractional-N Divider generating the feedback signal from the multiplied signal. In the preferred embodiment of the present invention, the first division circuit is the Fractional-N Divider. In one embodiment of the invention, the input to the Factional-N Divider varies over time thereby causing the output oscillator to sweep through a corresponding frequency range.

DETAILED DESCRIPTION OF THE INVENTION

Figure 1:
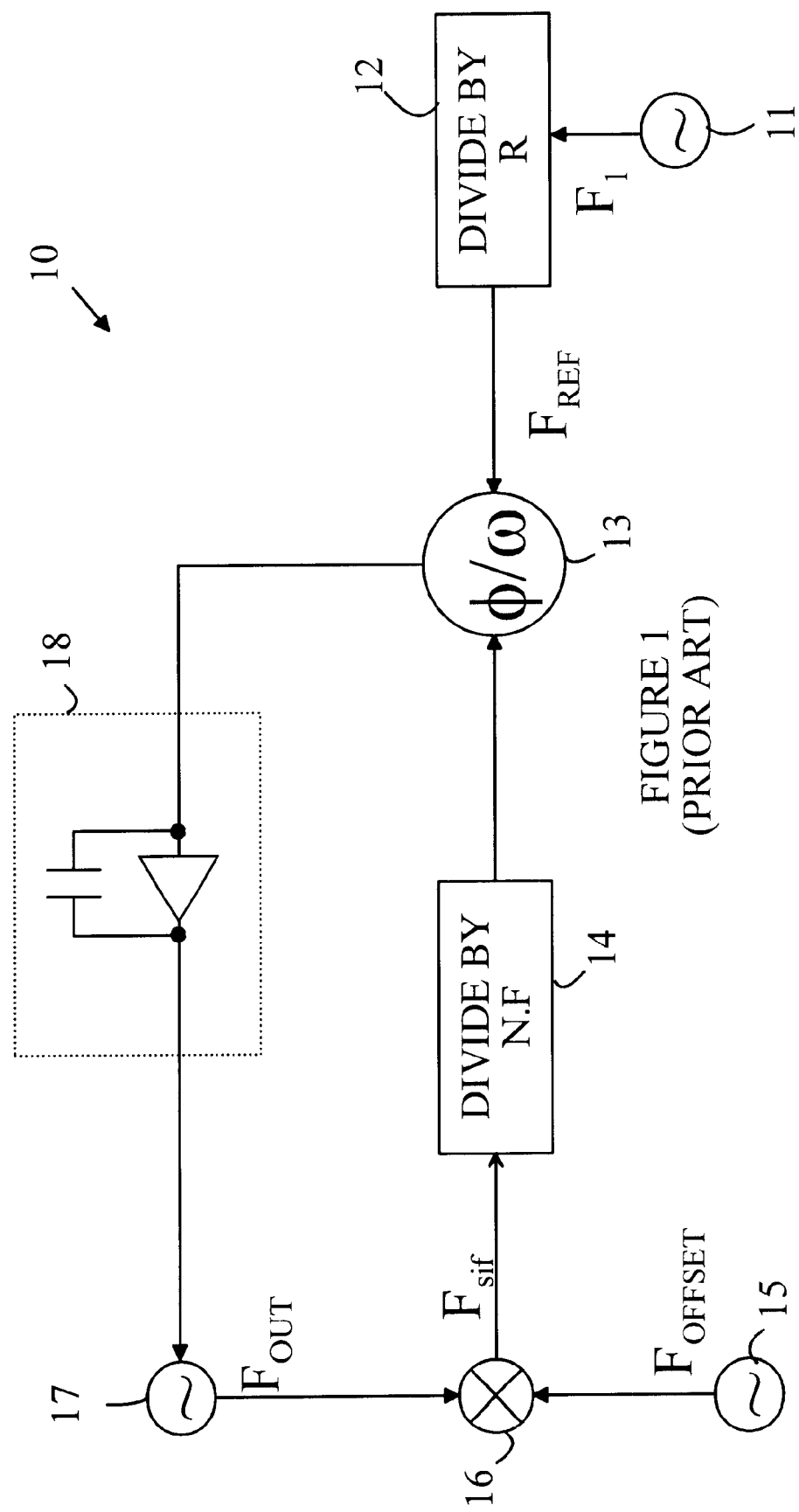
FIG. 1 is a schematic drawing of a prior art microwave synthesizer 10.

The manner in which the present invention provides its advantages may be more easily understood with reference to FIG. 1, which is a schematic drawing of a prior art microwave synthesizer 10. Synthesizer 10 utilizes a YTO 17 (Yttrium-Iron-Gamat Tuned Oscillator). A YTO is preferred because it provides a high quality microwave oscillator with wide tuning range and excellent tuning linearity. YTO 17 is controlled by the output of integrator 18 to set the final output frequency $F_{out}$. The output frequency is offset to provide a signal $F_{sif}$ by mixing an offset reference frequency $F_{offset}$ from signal generator 15 with the output signal utilizing mixer 16. By subtracting $F_{offset}$ from $F_{out}$ to produce $F_{sif}$, the division factor that must be provided by FND 14 is substantially reduced, thereby reducing the noise gain. $F_{sif}$ is then divided by FND 14 to generate the signal that is compared with the reference signal $F_{ref}$ in phase detector 13. The reference signal is typically at a fixed frequency $F_{ref}$ generated by dividing the output of a high frequency reference signal generator 11 using a conventional integer divider 12.

As noted above, there is a lower limit to the division factor that can be provided by FND 14. Hence, the maximum reduction in the noise gain obtained by utilizing the offset design to reduce the needed division factor is not obtainable in practice. To overcome this problem, prior art systems use a small fixed integer divider in place of FND 14 and a separate PLL with the FND to produce a tunable $F_{ref}$ to tune the output frequency of the microwave synthesizer. This conventional approach requires at least three PLLs: the main YTO loop, the offset loop to produce the $F_{offset}$ with coarse frequency steps, and the tunable reference loop to produce a $F_{ref}$ having fine frequency steps. The present invention provides the same level of noise reduction using only two PLLs.

Figure 2:
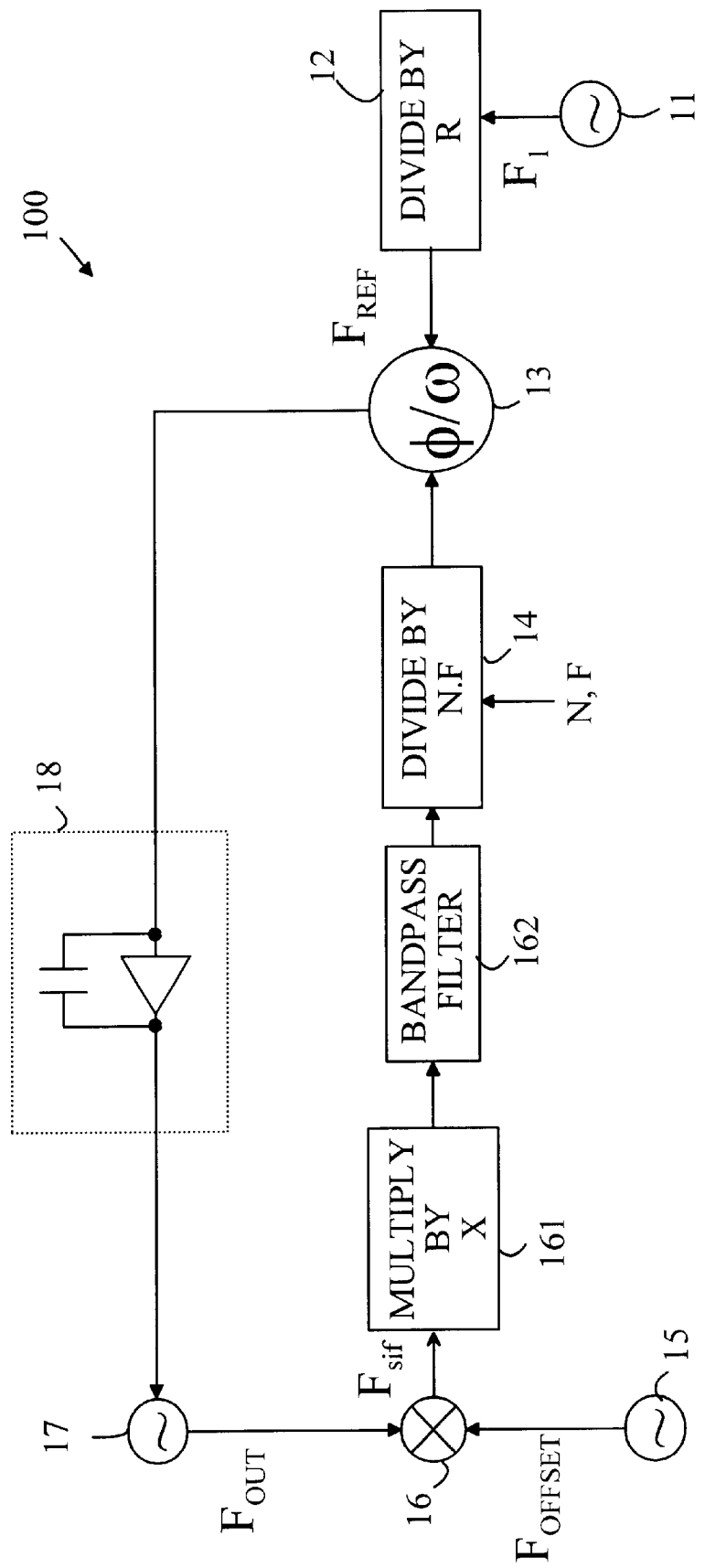
FIG. 2 is a schematic drawing of a first embodiment of a microwave synthesizer 100 according to the present invention.

Refer now to FIG. 2, which is a schematic drawing of a first embodiment of a microwave synthesizer 100 according to the present invention. To simplify the following discussion those elements of synthesizer 100 that serve the same function as elements shown in FIG. 1 have been given the same numeric designations as the corresponding elements in FIG. 1. Synthesizer 100 differs from synthesizer 10 in that a frequency multiplication circuit 161 has been inserted between mixer 16 and FND 14. A bandpass filter 162 blocks any undesired harmonics or side-bands created by multiplication circuit 161. Since $F_{sif}$ is increased by a factor of X, the resultant division factor is likewise increased by this factor. Hence, a FND having a minimum divisor of the order of 10 can be accommodated by utilizing a multiplication circuit that increases $F_{sif}$ by a factor of X=10. Since the noise gain is still determined by the ratio of $F_{sif}$ to $F_{ref}$, the offset frequency can be chosen such that $F_{sif}$ is close to $F_{ref}$, and hence, the noise gain in this case will be of the order of one.

It should be noted that synthesizer 100 can be caused to sweep a frequency range by altering the divisor utilized by FND 14. The divisor is specified by two integer values, N and F. When F is altered, the output frequency shifts accordingly. By incrementing or decrementing N.F with a small number, ΔN.F, every reference cycle, the value of N.F will be increasing or decreasing, respectively, causing the output frequency to sweep while maintaining a lock to the reference source.

Figure 3:
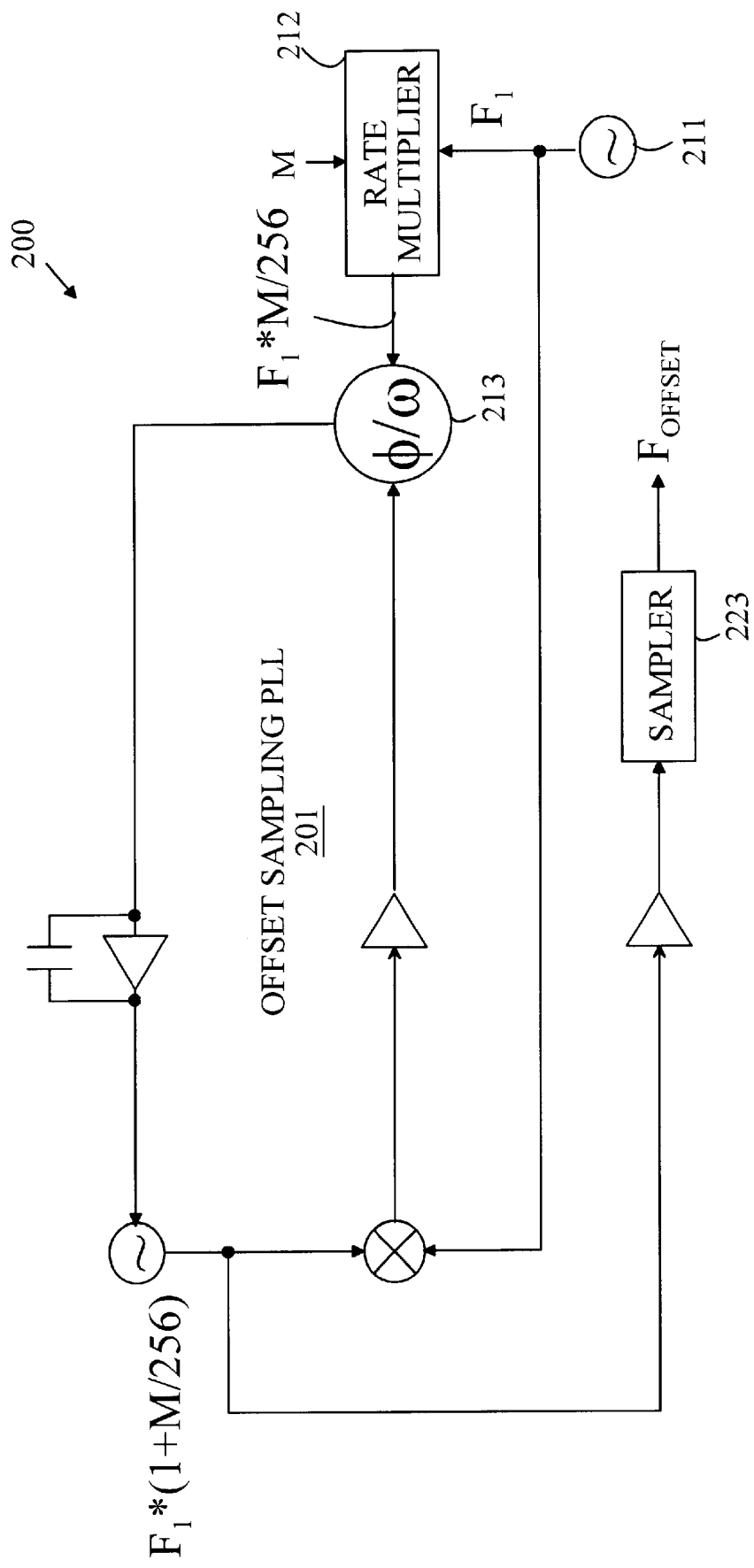
FIG. 3 is a schematic drawing of an offset signal generator 200 that may be utilized with the present invention.

The high frequency reference signal must be very clean to avoid adding phase noise to the synthesizer. While the offset reference does not need to have high frequency resolution, it must be able to cover the same wide frequency range as the synthesizer. Refer now to FIG. 3, which is a schematic drawing of an offset signal generator 200 that may be utilized with the present invention. Offset generator 200 uses a coarse frequency PLL 201 that drives a sampler 223. The coarse frequency PLL is referred to as the sampling oscillator PLL. To improve its phase noise performance, the sampling oscillator PLL is often an offset phase-lock loop. The high frequency reference source 211 is multiplied by a rational fraction M/256, where M is an integer. The reference source is also used as the offset source. Hence, the PLL 201 locks at a frequency of $F_1*(1+M/256)$ or $F_1*(1-M/256)$.

It should be noted that the loop divider for this design is unity, and hence the noise gain from the phase detector 213 to the sampling oscillator is 0 dB. The sampler produces a comb of the harmonics of the sampling signal that can be mixed with the microwave signal to produce the lower frequency signal $F_{sif}$ shown in FIG. 2.

While the embodiment shown in FIG. 2 reduces the phase noise, it requires a high-frequency bandpass filter that must track changes in the frequency of $F_{sif}$. Such changes will occur when the user changes the sweep range of the synthesizer. Such a bandpass filter requires careful design and can take up valuable board areas, and hence, embodiments that avoid this type of filter are preferred.

Figure 4:
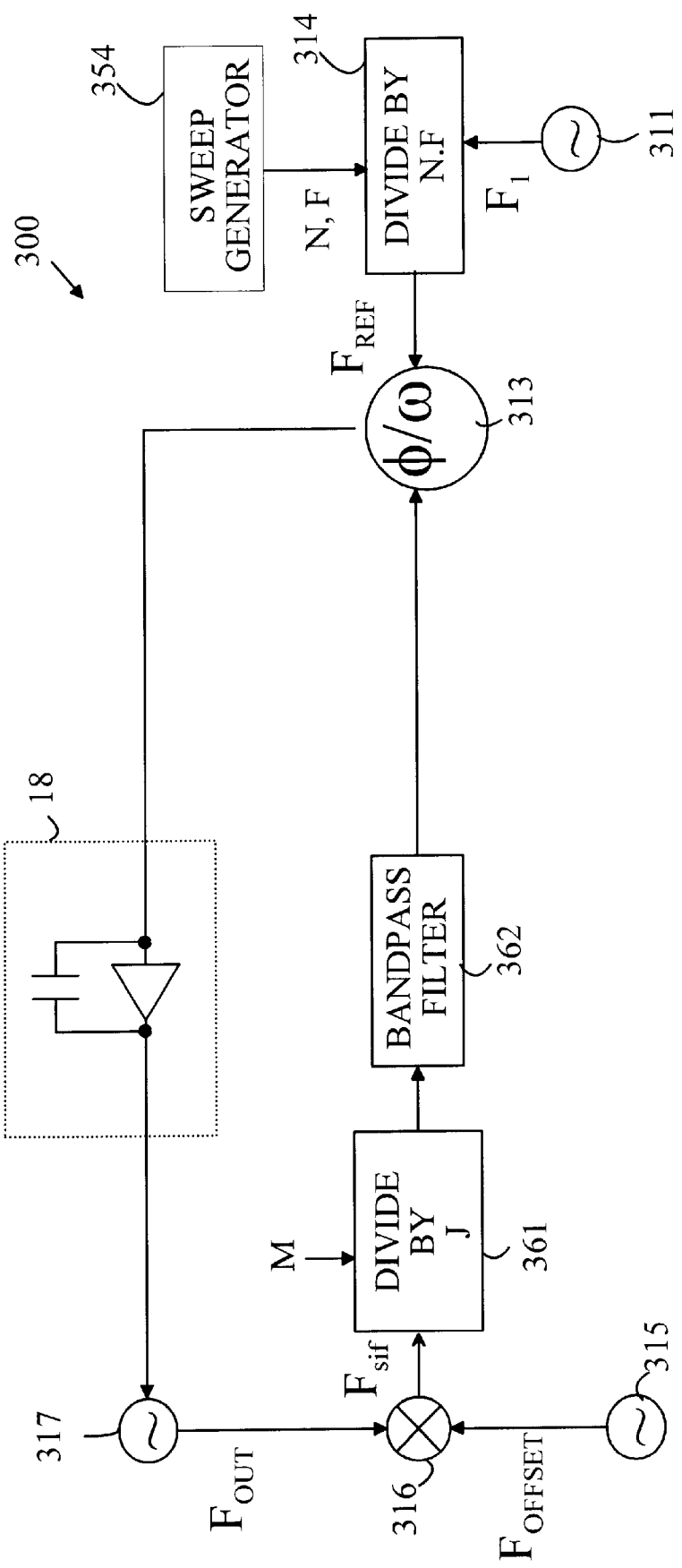
FIG. 4 is a schematic drawing of a synthesizer 300 according to another embodiment of the present invention.

Refer now to FIG. 4, which is a schematic drawing of a synthesizer 300 according to another embodiment of the present invention. Synthesizer 300 is constructed by swapping the reference and the feedback signals of the phase detector 313. The $F_{sif}$ signal generated by offsetting the output of voltage controlled oscillator 317 by the output of oscillator 315 in mixer 316 is divided by an integer J using a divider 361 followed by a fixed bandpass filter 362. The divided signal is then fed into one input of phase detector 313. A high frequency reference signal from oscillator 311 is divided by FND 314 to produce a dithered reference signal that can be caused to sweep a desired frequency range. The dithered reference signal provides the other input to phase detector 313.

Consider the case in which $F_{sif}$ is set between 50 and 70 MHz. The integer divider 361 is provided with a J value of either 5, 6 or 7 so that its output is as high as possible but does not exceed the output frequency limit of the FND 314, which is typically 10 MHz. For example, with an $F_{sif}$ of 50 MHz, J would be set to be 5 so that the feedback signal into phase detector 314 is 10 MHz. With the 600 MHz reference signal from oscillator 311, the FND would be set to 60 to produce the 10 MHz signal into the reference input of phase detector 314. The loop would then lock, and the noise gain would be 20 $\log(F_{sif}/F_{ref})$=20 $\log(J)$ or 14 dB.

This noise gain is the same as that provided by the embodiment shown in FIG. 2, which would, in this case, set the multiplier X to be 5, producing a 250 MHz signal for the FND with a N.F of 25 to generate the 10 MHz output signal to lock to the 10 MHz $F_{ref}$. However, the programmable divider J is a digital IC that costs less than $0.50 and occupies very little board area. In addition, the bandpass filter is very easy to implement since the required Q is much lower at the lower frequency. Hence, the embodiment shown in FIG. 4 is substantially less expensive.

The embodiment shown in FIG. 4 has one drawback compared to that shown in FIG. 2. Synthesizer 100 can be caused to linearly sweep a frequency range by changing N.F in a linear fashion. With synthesizer 300, the output frequency is inversely proportional to the value of the input to the FND. This is in general not a problem for a fixed frequency output. However any frequency sweep based on a linear change in N.F will be non-linear. If the sweep range is small, the non-linearity is so small that it can be ignored. If a larger sweep range is needed, the range of N.F values can be swept in a non-linear manner utilizing a sweep generator 354 such that the resultant sweep is linear.

Various modifications to the present invention will become apparent to those skilled in the art from the foregoing description and accompanying drawings. Accordingly, the present invention is to be limited solely by the scope of the following claims.

What is claimed is:

1. A frequency synthesizer comprising:

an output oscillator for generating an output signal whose frequency, $F_{OUT}$, is determined by an oscillator input signal;

a difference circuit for generating a sampled signal having a frequency, $F_{sif}=F_{OUT}-F_{OFFSET}$;

a reference circuit for generating a reference signal having a frequency $F_{ref}$, said reference circuit comprising a reference oscillator for generating a reference oscillator output signal having a frequency $F_1$ and a first division circuit for generating a signal having a frequency equal to $F_1$ divided by R;

a feedback signal generating circuit for generating a feedback signal having a frequency, $F_{fb}$, said feedback signal generating circuit comprising a second division circuit and wherein $F_{sif}/F_{fb}<10$; and a comparator for comparing said reference signal and said feedback signal and generating said oscillator input signal, wherein one of said first and second division circuits is a Fractional-N Divider having a division factor, N.F, greater than 10.

2. A frequency synthesizer comprising:

an output oscillator for generating an output signal whose frequency, $F_{OUT}$, is determined by an oscillator input signal;

a difference circuit for generating a sampled signal having a frequency, $F_{sif}=F_{OUT}-F_{OFFSET}$;

a reference circuit for generating a reference signal having a frequency $F_{ref}$, said reference circuit comprising a reference oscillator for generating a reference oscillator output signal having a frequency $F_1$ and a first division circuit for generating a signal having a frequency equal to $F_1$ divided by R;

a feedback signal generating circuit for generating a feedback signal having a frequency, $F_{fb}$, said feedback signal generating circuit comprising a second division circuit and wherein $F_{sif}/F_{fb}<10$; and a comparator for comparing said reference signal and said feedback signal and generating said oscillator input signal, wherein one of said first and second division circuits is a Fractional-N Divider having a division factor, N.F, greater than 10, wherein said second division circuit is said Fractional-N Divider and wherein said feedback comprises a multiplication circuit for generating a multiplied signal having a frequency equal to X times $F_{sif}$, said Fractional-N Divider generating said feedback signal from said multiplied signal.

3. The synthesizer of claim 2 wherein said multiplication circuit comprises an integer multiplication circuit for multiplying said sampled frequency by X and a bandpass filter for blocking signals having frequencies outside of a frequency band about $X*F_{sif}$.

4. A frequency synthesizer comprising:

an output oscillator for generating an output signal whose frequency, $F_{OUT}$, is determined by an oscillator input signal;

a difference circuit for generating a sampled signal having a frequency, $F_{sif}=F_{OUT}-F_{OFFSET}$;

a reference circuit for generating a reference signal having a frequency $F_{ref}$, said reference circuit comprising a reference oscillator for generating a reference oscillator output signal having a frequency $F_1$ and a first division circuit for generating a signal having a frequency equal to $F_1$ divided by R;

a feedback signal generating circuit for generating a feedback signal having a frequency, $F_{fb}$, said feedback signal generating circuit comprising a second division circuit and wherein $F_{sif}/F_{fb}<10$; and a comparator for comparing said reference signal and said feedback signal and generating said oscillator input signal, wherein one of said first and second division circuits is a Fractional-N Divider having a division factor, N.F, greater than 10, wherein said first division circuit is said Fractional-N Divider.

5. A frequency synthesizer comprising:

an output oscillator for generating an output signal whose frequency, $F_{OUT}$, is determined by an oscillator input signal;

a difference circuit for generating a sampled signal having a frequency, $F_{sif}=F_{OUT}-F_{OFFSET}$;

a reference circuit for generating a reference signal having a frequency $F_{ref}$, said reference circuit comprising a reference oscillator for generating a reference oscillator output signal having a frequency $F_1$ and a first division circuit for generating a signal having a frequency equal to $F_1$ divided by R;

a feedback signal generating circuit for generating a feedback signal having a frequency, $F_{fb}$, said feedback signal generating circuit comprising a second division circuit and wherein $F_{sif}/F_{fb}<10$;

a comparator for comparing said reference signal and said feedback signal and generating said oscillator input signal, wherein one of said first and second division circuits is a Fractional-N Divider having a division factor, N.F, greater than 10; and a circuit for causing said division factor of said Fractional-N divider to vary over time thereby causing said output oscillator to sweep through a corresponding frequency range.

* * * * *